(12) United States Patent
Kim et al.

(10) Patent No.: US 10,304,998 B2
(45) Date of Patent: May 28, 2019

(54) LIGHT EMITTING DIODE CHIP AND LIGHT EMITTING DEVICE HAVING THE SAME

(71) Applicant: Seoul Viosys Co., Ltd., Ansan-si (KR)

(72) Inventors: Chang Hoon Kim, Ansan-si (KR); Sang Min Kim, Ansan-si (KR); Chi Hyun In, Ansan-si (KR); Hong Suk Cho, Ansan-si (KR); Dae Seok Park, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/498,910

(22) Filed: Sep. 26, 2014

(65) Prior Publication Data

US 2015/0091042 A1 Apr. 2, 2015

(30) Foreign Application Priority Data

Sep. 27, 2013 (KR) .......... 10-2013-0115318
Sep. 27, 2013 (KR) .......... 10-2013-0115321
Sep. 30, 2013 (KR) .......... 10-2013-0116381

(51) Int. Cl.
*H01L 33/24* (2010.01)
*H01L 33/38* (2010.01)
(Continued)

(52) U.S. Cl.
CPC .............. *H01L 33/38* (2013.01); *H01L 24/14* (2013.01); *H01L 33/62* (2013.01); *H01L 2924/12041* (2013.01); *H01L 2924/12042* (2013.01)

(58) Field of Classification Search
CPC .......... H01L 33/62; H01L 33/486; H01L 2224/48091; H01L 33/32; H01L 33/38; H01L 51/5246; H01L 51/524; H01L 24/14
See application file for complete search history.

(56) References Cited

U.S. PATENT DOCUMENTS 8,633,503 B2  1/2014 Seo
2002/0179914 A1* 12/2002 Sheu .......................... 257/90
(Continued)

FOREIGN PATENT DOCUMENTS

CN  204167352 U  2/2015

OTHER PUBLICATIONS

Office Action in Chinese Patent Application No. 201611070944.1, dated Apr. 3, 2018.

*Primary Examiner* — Kenneth Parker
*Assistant Examiner* — Long H Le
(74) *Attorney, Agent, or Firm* — Perkins Coie LLP

(57) ABSTRACT

A light emitting diode (LED) chip can include: a first pattern region having one or more curved parts; and a second pattern region at least partially surrounding the first pattern region. The first pattern region can include a first conductive type nitride-based semiconductor layer, an active layer, a second conductive type nitride-based semiconductor layer, a top electrode layer, and a top bump layer stacked over a substrate, the second pattern region can include a first conductive type nitride-based semiconductor layer, a bottom electrode layer, and a bottom bump layer stacked over the substrate, and the first pattern region can include one or more protrusion patterns formed in the one or more curved part.

15 Claims, 13 Drawing Sheets

(51) Int. Cl.
  *H01L 33/62* (2010.01)
  *H01L 33/40* (2010.01)
  *H01L 33/36* (2010.01)
  *H01L 23/00* (2006.01)

(56) References Cited

U.S. PATENT DOCUMENTS

| | | | |
|---|---|---|---|
| 2008/0296603 A1* | 12/2008 | Chu | H01L 33/38 257/99 |
| 2010/0012971 A1* | 1/2010 | Hiraoka | H01L 33/38 257/103 |
| 2011/0210345 A1* | 9/2011 | Lim | H01L 33/20 257/88 |
| 2012/0241760 A1* | 9/2012 | Okabe | H01L 33/38 257/76 |
| 2014/0120641 A1 | 5/2014 | Kim et al. | |
| 2015/0295139 A1* | 10/2015 | Park | H01L 33/44 257/99 |

* cited by examiner

LIGHT EMITTING DIODE CHIP AND LIGHT EMITTING DEVICE HAVING THE SAME

CROSS-REFERENCES TO RELATED APPLICATIONS

This patent document claims the priorities to and benefits of Korean application numbers 10-2013-0115318, filed on Sep. 27, 2013, 10-2013-0115321, filed on Sep. 27, 2013, and 10-2013-0116381, filed on Sep. 30, 2013, which are incorporated by reference in their entireties.

BACKGROUND

The disclosure of this patent document generally relates to a light emitting diode (LED) chip and a light emitting device having the same.

An LED is a photoelectric conversion element which applies a forward current to both ends of a P-N junction and emits light. In general, the LED is implemented as a module and released as a commercial product, through an epi-wafer fabrication process, a chip fabrication process, a packaging process, and a module process. Recently, as the LED is applied to a device such as a lighting device which requires high power, research has been actively conducted to increase the efficiency of the LED, such as light emission efficiency.

SUMMARY

In one embodiment, an LED chip include: a first pattern region having one or more curved parts; and a second pattern region at least partially surrounding the first pattern region. The first pattern region can include a first conductive type nitride-based semiconductor layer, an active layer, a second conductive type nitride-based semiconductor layer, a top electrode layer, and a top bump layer, which are stacked over a substrate. The second pattern region can include a first conductive type nitride-based semiconductor layer, a bottom electrode layer, and a bottom bump layer, which are stacked over the substrate. The first pattern region can include one or more protrusion patterns formed in the one or more curved parts.

In another embodiment, an LED chip include: a first pattern layer region; a second pattern layer region arranged in the first pattern layer region; and a third pattern layer region at least partially surrounding the first pattern layer region. The first pattern layer region can include a first conductive type nitride-based semiconductor layer and a bottom electrode layer, which are stacked over a substrate. Each of the second and third pattern layer regions can include a first conductive type nitride-based semiconductor layer, an active layer, a second conductive type nitride-based semiconductor layer, and a top electrode layer, which are stacked over the substrate.

In another embodiment, an LED chip include: a first pattern layer region having one or more curved parts; a second pattern layer region at least partially surrounding the first pattern layer region. The first pattern layer regioncan include a first conductive type nitride-based semiconductor layer and a bottom electrode layer, which are stacked over a substrate. The second pattern layer region can include a first conductive type nitride-based semiconductor layer, an active layer, a second conductive type nitride-based semiconductor layer, and a top electrode layer, which are stacked over the substrate.

In another embodiment, an LED package may include an LED chip and a submunt substrate. The LED chip can include a substrate including a material having a light transmitting property, a first semiconductor layer disposed over the substrate and doped with a first conductive type impurity, an active layer disposed over the first semiconductor layer structured to emit light at a predetermined level of energy, a second semiconductor layer disposed over the active layer and doped with a second conductivity type impurity, and a guard pattern disposed over the first semiconductor layer near an edge of the first semiconductor layer. The submunt substrate can be structured to form a flip-chip bond with the LED chip. The submunt substrate can include a substrate base, inner and outer bond pads disposed over the substrate base to electrically couple with the first and second semiconductor layers of the LED chip, and a submunt substrate guard pattern disposed between the inner bond pads and the outer bond pads to bond with the guard pattern of the LED chip to seal the LED chip with the submunt substrate.

DESCRIPTION OF SPECIFIC EMBODIMENTS

Figure 1:
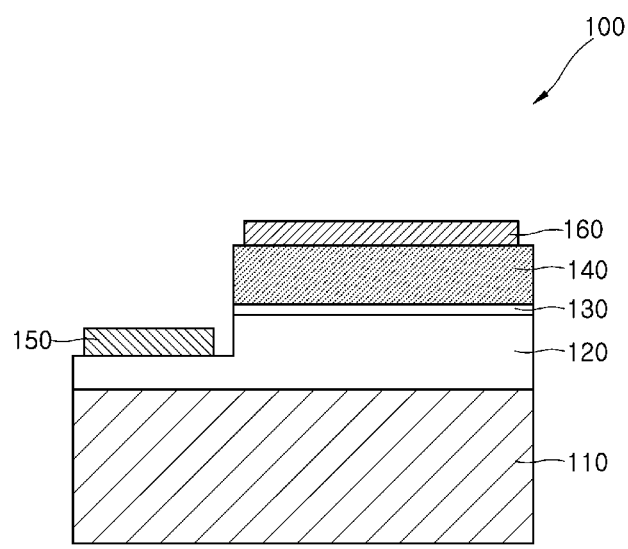
FIG. 1 schematically illustrates an example of a conventional lateral LED chip.

Hereinafter, exemplary embodiments of the disclosed technology will be described in more detail with reference to the accompanying drawings. However, the disclosed technology is not limited to the embodiments described in this patent document, and can be specified or applied in other forms, structures, and implementations. In the drawings, the thickness or size of each component is exaggerated in some aspects for convenience in description and clarity.

In this patent document, when one element is referred to as being positioned 'over' or 'under' another element, it may indicate that the former element can be directly positioned 'over' or 'under' the latter element or an additional element can be interposed between different elements. In this patent document, the term 'top' or 'bottom' is a relational concept set from the point of view of an observer. When the point of view of the observer is changed, 'top' may indicate 'bottom' or 'bottom' may indicate 'top'.

In the drawings, like reference numerals represent the same elements. Furthermore, the terms of a singular form may include plural forms unless referred to the contrary. Furthermore, the term 'include or comprise' or 'have' specifies a property, a number, a step, a process, an element, a part, or a combination thereof, but does not exclude one or more other properties, numbers, steps, processes, elements, parts, or combinations thereof.

LED chips fabricated through the chip fabrication process may be divided into lateral LED chips and vertical LED chips, depending on the arrangement of electrodes. FIG. 1 schematically illustrates an example of a conventional lateral LED chip. Referring to FIG. 1, the conventional lateral LED chip 100 includes a sapphire substrate 110, an N-type gallium nitride layer 120, a gallium nitride-based active layer 130, a P-type gallium nitride layer 140, an N-type electrode layer 150, and a P-type electrode layer 160. Electrons provided through the N-type gallium nitride layer 120 from the N-type electrode layer 150 and holes provided through the P-type gallium nitride layer 140 from the P-type electrode layer 160 are combined at the gallium nitride-based active layer 130 and emit light. As illustrated in FIG. 1, the conventional lateral LED chip 100 employs the sapphire substrate 110 formed of or include an insulator, and the N-type electrode layer 150 and the P-type electrode layer 160 are arranged on planes parallel to the sapphire substrate 110.

Figure 2:
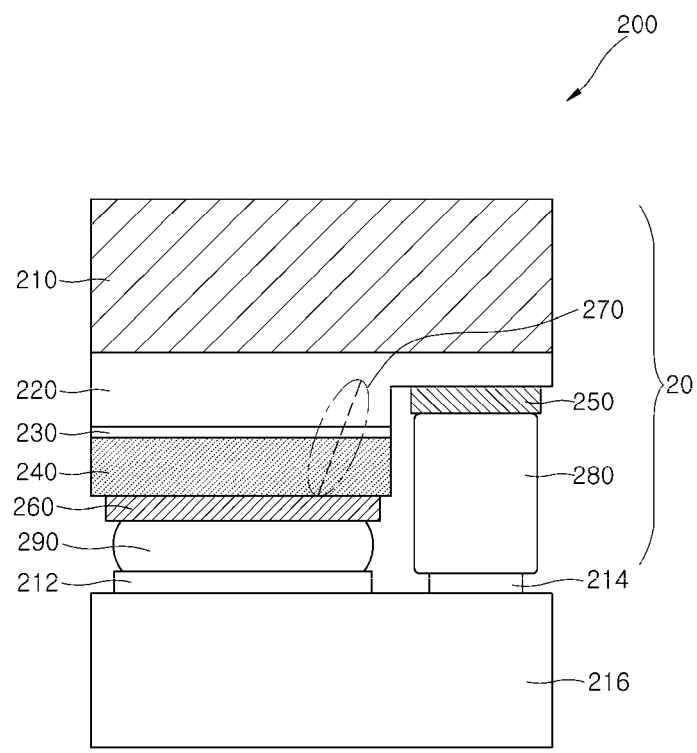
FIG. 2 schematically illustrates a conventional flip-chip LED package device.

Recently, much attention has been paid to a flip-chip LED package device which is capable of improving light emission efficiency and heat radiation efficiency. FIG. 2 schematically illustrates a conventional flip-chip LED package device 200. Referring to FIG. 2, an LED chip 20 is connected to first and second electrodes 212 and 214 of a submount substrate 216 through an N-type solder 280 and a P-type solder 290 which are formed on or disposed over an N-type electrode layer 250 and a P-type electrode layer 260, respectively, to form or fabricate the flip-chip LED package device 200. The LED chip 20 includes a transparent substrate 210, an N-type gallium nitride layer 220, a gallium nitride-based active layer 230, a P-type gallium nitride layer 240, the N-type electrode layer 250, and the P-type electrode layer 260. In the flip-chip LED package device 200, light emitted from the gallium-nitride active layer 230 is emitted to the outside through the transparent substrate 210.

An LED chip disclosed in this patent document can include a nitride-based semiconductor layer to emit ultraviolet (UV) light, visible light, or infrared rays. The LED chip disclosed in this patent document can be implemented as a flip-chip connected to a submunt substrate through a top bump layer and a bottom bump layer which are arranged over a top electrode layer and a bottom electrode layer. The submunt substrate can indicate a type of package substrate housing an LED chip.

In general, it has been reported that, since a flip-chip LED package device has or tend to have higher heat radiation efficiency than existing non-flip-chip light emitting devices and light extinction does not substantially occur, the light emission efficiency of the flip-chip LED package device is increased to 50% or more, compared to the existing non-flip-chip light emitting devices. However, despite such advantages, the flip-chip LED package device can potentially have the following disadvantages. As illustrated in FIG. 2, a current flow 270 among the N-type gallium nitride 220, the gallium nitride-based active layer 230, and the P-type gallium nitride layer 240 can be concentrated along a specific path having low electrical resistance, at least because the N-type gallium nitride layer 220 has lower electrical conductivity than a metal. For example, the current flow 270 can be formed between the gallium nitride-based active layer 230 and the P-type gallium nitride layer 240 along a specific path having low electrical resistance in the N-type gallium nitride layer 220. When such a phenomenon occurs, light may not be emitted through the entire area of the gallium nitride-based active layer 230. Thus, the light emission efficiency and reliability of the LED package device can be degraded. Furthermore, in order to increase light intensity, an operating voltage or operating current needs to be increased in some cases.

When the LED chip is mounted on the submount substrate through the use of a flip-chip structure, the surface of the LED chip may be exposed to the air. At this time, moisture may be absorbed through the surface exposed to the air and degrade the reliability of the light emitting device (e.g., the LED package device). In particular, the reliability of the light emitting device can be further degraded in a high-temperature and high-humidity environment. In order to prevent the moisture absorption, an underfill technique can be applied to fill the space between the light emitting cell (e.g., the LED chip) and the submount substrate with a resin member including silica ($SiO_2$). However, the underfill technique can have a limitation in completely preventing the exposure of the first and second electrodes 212 and 214 formed of or include metal. Furthermore, a large quantity of photons generated from the active layer 230 can be absorbed in the underfill resin layer. In this case, the photons may not reliably escape to the outside of the light emitting device, but the optical output of the light emitting device may be degraded.

Figure 3:
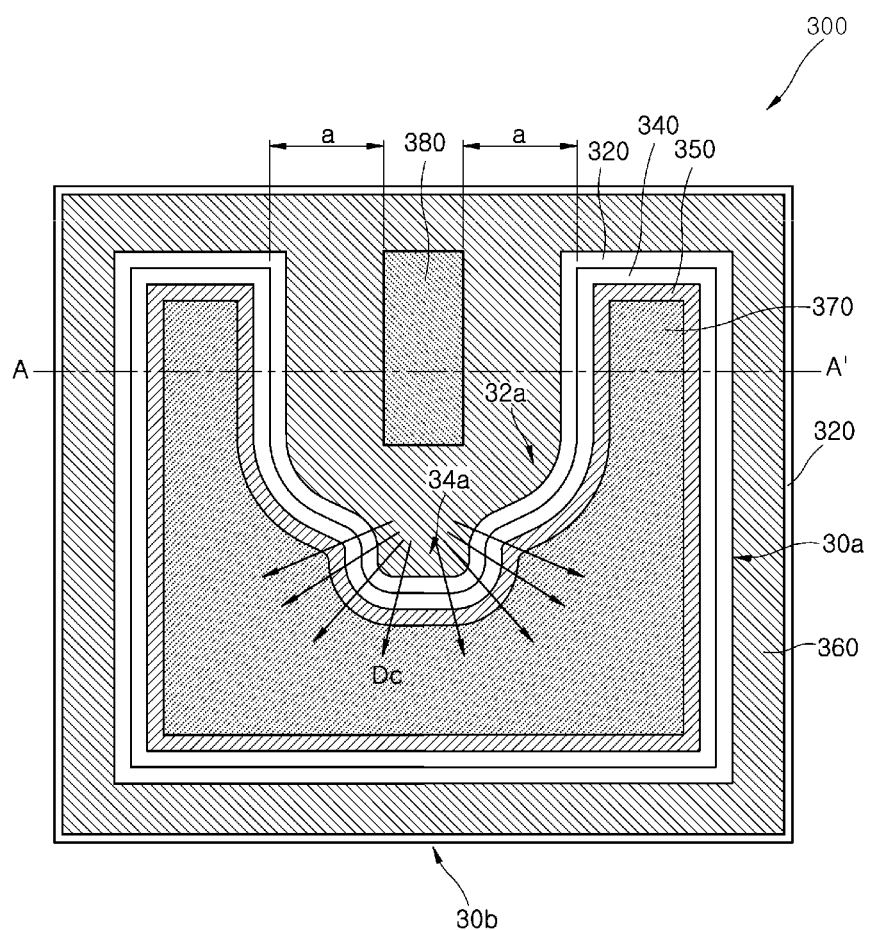
FIG. 3 is a schematic plan view of an exemplary LED chip in accordance with an embodiment of the disclosed technology.
Figure 4:
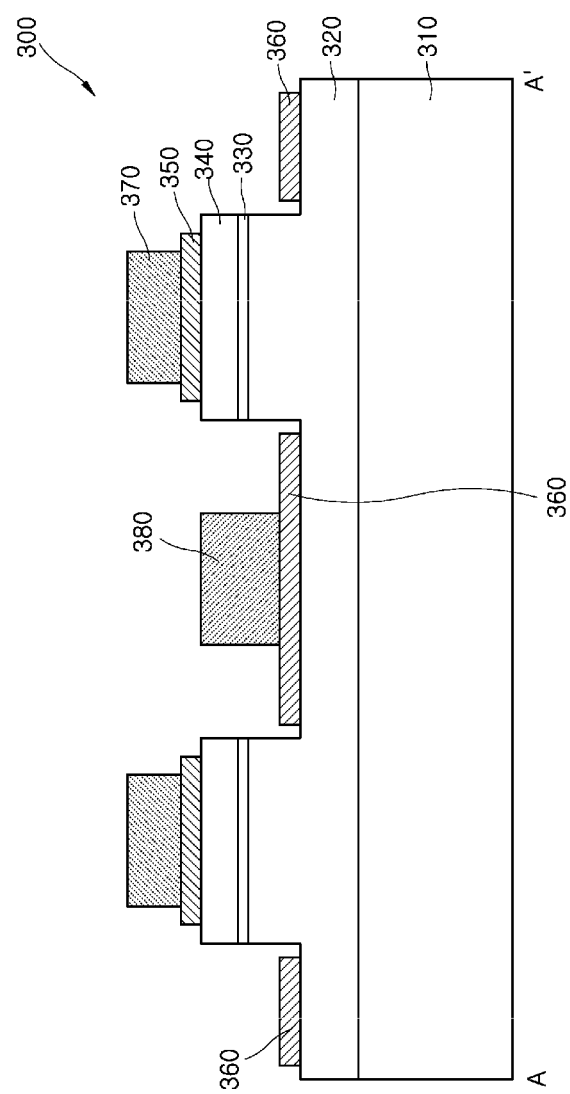
FIG. 4 is a cross-sectional view of the exemplary LED chip of FIG. 3, taken along line A-A'.

FIG. 3 is a schematic plan or top-down view of an exemplary LED chip 300 in accordance with an embodiment of the disclosed technology. FIG. 4 is a cross-sectional view of the exemplary LED chip 300 of FIG. 3, taken along line A-A'. Referring to FIGS. 3 and 4, the LED chip 300 may include a first pattern region 30a and a second pattern region 30b surrounding the first pattern region 30a. The LED chip 300 can have a structure that emits light to the outside through a substrate 310, and include top and bottom bump layers 370 and 380 for flip-chip connection with a submount substrate.

The first pattern region 30a can include a first conductive type nitride-based semiconductor layer 320, an active layer 330, and a second conductive type nitride-based semiconductor layer 340, which are stacked over the substrate 310 in one example. The first conductive type nitride-based semiconductor layer 320, active layer 330, and second conductive type nitride-based semiconductor layer 340 can be arranged over the substrate 310 in various ways to have a stacked structure as shown in FIGS. 3 and 4. In the plan pattern of FIG. 3, the first pattern region 30a can include one or more curved parts 32a. The one or more curved parts 32a can be shaped to indicate a U-shaped pattern region having a predetermined width in the first pattern region 30a. In another embodiment, the one or more curved parts 32a can be shaped to indicate a V-shaped pattern region. In addition, orientation of the described U-shaped and V-shaped pattern regions can be rotated with respect to the substrate 310 to indicate upside-down U-shape or V-shape, and side-ways U-shape or V-shape, for example.

The second pattern region 30b can include the first conductive type nitride-based semiconductor layer 320 stacked over the substrate 310. The second pattern region 30b can indicate a region in which the substrate 310, the first conductive type nitride-based semiconductor layer 320, and a bottom electrode layer 360 are sequentially stacked. However, the first conductive type nitride-based semiconductor layer 320, and a bottom electrode layer 360 can be arranged over the substrate 310 in various ways to have a stacked structure as shown in FIGS. 3 and 4.

For example, the substrate 310 can be formed of or include a transparent material such as sapphire ($Al_2O_3$). The first conductive type nitride-based semiconductor layer 320 can include a gallium nitride-based compound doped with an N-type or P-type dopant. For example, the first conductive type semiconductor layer 320 can include gallium nitride (GaN), aluminum gallium nitride ($Al_xGa_{1-x}N$: 0<x<1), indium gallium nitride (InGaN), or aluminum indium gallium nitride ($Al_xIn_yGa_{1-x-y}N$: 0≤x,y,x+y≤1), which is doped with an N-type or P-type dopant. The N-type dopant can include silicon (Si), for example, and the P-type dopant can include magnesium (Mg), zinc (Zn), cadmium (Cd), or a combination of two or more of Mg, Zn or Cd, for example. The first conductive type nitride-based semiconductor layers 320 of the first pattern region 30a and the second pattern region 30b can be physically coupled to each other.

The active layer 330 can be arranged over the first conductive type nitride-based semiconductor layer 320 of the first pattern region 30a. The active layer 330 can generate light through a combination of electrons and holes which are provided from the first conductive type nitride-based semiconductor layer 320 and the second conductive type nitride-based semiconductor layer 340. In accordance with an embodiment, the active layer 330 can have a multiple quantum well (MQW) structure to increase the combined efficiency of electrons and holes. For example, the active layer 330 can include indium gallium nitride (InGaN), gallium nitride (GaN), gallium aluminum nitride ($Ga_{1-a}Al_aN$, 0<a<1), aluminum indium gallium nitride ($Al_xIn_yGa_{1-x-y}N$: 0≤x,y,x+y≤1), or a combination of two or more of (InGaN), (GaN), ($Ga_{1-a}Al_aN$, 0<a<1), or ($Al_xIn_yGa_{1-x-y}N$: 0≤x,y,x+y≤1).

The second conductive type nitride-based semiconductor layer 340 can be arranged over the active layer 330 of the first pattern region 30a. The second conductive type nitride-based semiconductor layer 340 can include a gallium nitride-based compound doped with an N-type or P-type dopant. For example, the second conductive type nitride-based semiconductor layer 340 can include gallium nitride (GaN), aluminum gallium nitride ($Al_xGa_{1-x}N$: 0<x<1), indium gallium nitride (InGaN), or aluminum indium gallium nitride ($Al_xIn_yGa_{1-x-y}N$: 0≤x,y,x+y≤1), which is doped with an N-type or P-type dopant. The N-type dopant may include silicon (Si), for example, and the P-type dopant may include Mg, Zn, Cd, or a combination of two or more or Mg, Zn, or Cd, for example.

When the first conductive type nitride-based semiconductor layer 320 is doped with an N-type dopant, the second conductive type nitride-based semiconductor layer 340 can be doped with a P-type dopant, and when the first conductive type nitride-based semiconductor layer 320 is doped with a P-type dopant, the second conductive type nitride-based semiconductor layer 340 can be doped with a P-type dopant.

Referring back to the drawing of FIGS. 3 and 4, a top electrode layer 350 can be arranged over the second conductive type nitride-based semiconductor layer 340 of the first pattern region 30a. The top electrode layer 350 can include metals such as titanium, aluminum, chrome, nickel and gold, for example. The top electrode layer 350 can have a stacked structure of one or more layers formed of or include an alloy of the metals. As illustrated in FIG. 3, the top electrode layer 350 can be arranged to cover the most or a substantial part of the second conductive type nitride-based semiconductor layer 340. The top electrode 350 can be formed along a boundary line defining the first pattern region 30a.

A bottom electrode layer 360 can be arranged over the first conductive type nitride-based semiconductor layer 320 of the second pattern region 30b. The bottom electrode layer 360 can include a metal such as titanium, aluminum, chrome, nickel, or gold, for example. The bottom electrode layer 360 can have a stacked structure of one or more layers formed of or include an alloy of the metals. As illustrated in FIG. 3, the bottom electrode layer 360 can be arranged to surround the first pattern region 30a.

In the present embodiment, the top bump layer 370 and the bottom bump layer 380 can be arranged over the top electrode layer 350 and the bottom electrode layer 360, respectively. The top bump layer 370 and the bottom bump layer 380 can receive power from a submount substrate, and apply the received power to the top electrode layer 350 and the bottom electrode layer 360, respectively. Thus, the arrangement shape and area of the top bump layer 370 and the bottom bump layer 380 and the configuration of the top electrode layer 350 and the bottom electrode layer 360 can have an influence on current crowding in the first conductive type nitride-based semiconductor layer 320.

As illustrated in FIG. 3, the top bump layer 370 can be formed along the boundary line defining the top electrode layer 350. For example, the top bump layer 370 can be arranged to correspond to the shape of the top electrode layer 350, in order to cover the most or a substantial part of the top electrode layer 350. In another embodiment, the top bump layer 370 can be arranged to have various patterns over the top electrode layer 350, like the bottom bump layer 380 of FIG. 3.

Referring back to FIG. 3, the bottom bump layer 380 can be arranged to be surrounded by the one or more curved parts 32a of the first pattern region 30a. That is, the bottom bump layer 380 can be arranged on a part of the bottom electrode layer 360 surrounded by the one or more curved parts 32a. In accordance with an embodiment, the bottom bump layer 380 can be arranged in such a manner that distances (a) from the bottom bump layer 380 to the one or more curved parts 32a in both lateral directions are equal to each other, on the plan pattern of FIG. 3. For example, the distance from either side of the bottom bump layer 380 to a neighboring portion of the first conductive type nitride-based semiconductor layer 320 of the first pattern region 30a is the same distance (a). Thus, the distance at which electric charges are introduced into the first pattern region 30a from the bottom bump layer 380 can be relatively shortened. Thus, electric charges having a predetermined current spreading length can be spread across a wider area of the first pattern region 30a. For example, it is possible to increase the area of the current spreading into the first conductive type nitride-based semiconductor layer 320 of the first pattern region 30a through the bottom electrode layer 360 and the first conductive type nitride-based semiconductor layer 320 of the second pattern region 30b from the bottom bump layer 380. Furthermore, the current path to the first conductive type nitride-based semiconductor layer 320 of the first pattern region 30a through the first conductive type nitride-based semiconductor layer 320 of the second pattern region 30b from the bottom bump layer 380 can be more uniformly controlled. As described above, FIG. 3 illustrates that the curved part 32a has a U-shaped pattern.

However, even when the curved part 32a has a V-shaped pattern or any other curved shapes, the same effect can be obtained.

In the present embodiment, the first pattern region 30a may include one or more protrusion patterns 34a on one or more surfaces facing the bottom bump layer 380. As illustrated in FIG. 3, the protrusion pattern 34a can be arranged in the one or more U-shaped or V-shaped curved parts 32a. The protrusion pattern 34a can increase the size of the boundary surface between the first and second pattern regions 30a and 30b. Thus, it is possible to increase the area of current spreading Dc as indicated by the straight arrows from the first conductive type nitride-based semiconductor layer 320 of the second pattern region 30b to the first conductive type nitride-based semiconductor layer 320 of the first pattern region 30a at the boundary surface.

As the first pattern region 30a includes the one or more curved parts 32a and the protrusion pattern 34a, the extent of current spreading Dc at the boundary surface between the first and second pattern regions 30a and 30b may be increased. Thus, electrical resistance within the first conductive type nitride-based semiconductor layer 320 may be reduced, and a uniform current for light emission of the LED chip can be provided. Thus, the forward voltage of the LED chip can be reduced.

Figure 5A:
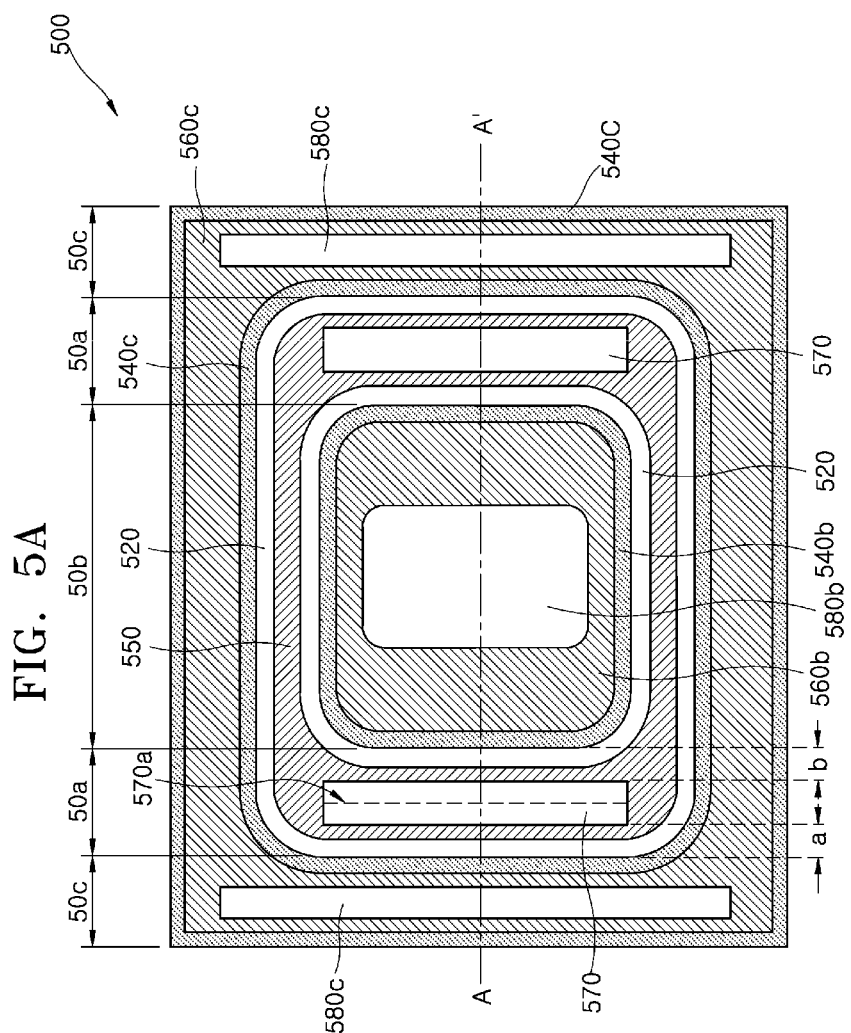
FIG. 5A is a schematic plan view of an exemplary LED chip in accordance with an embodiment of the disclosed technology.
Figure 5B:
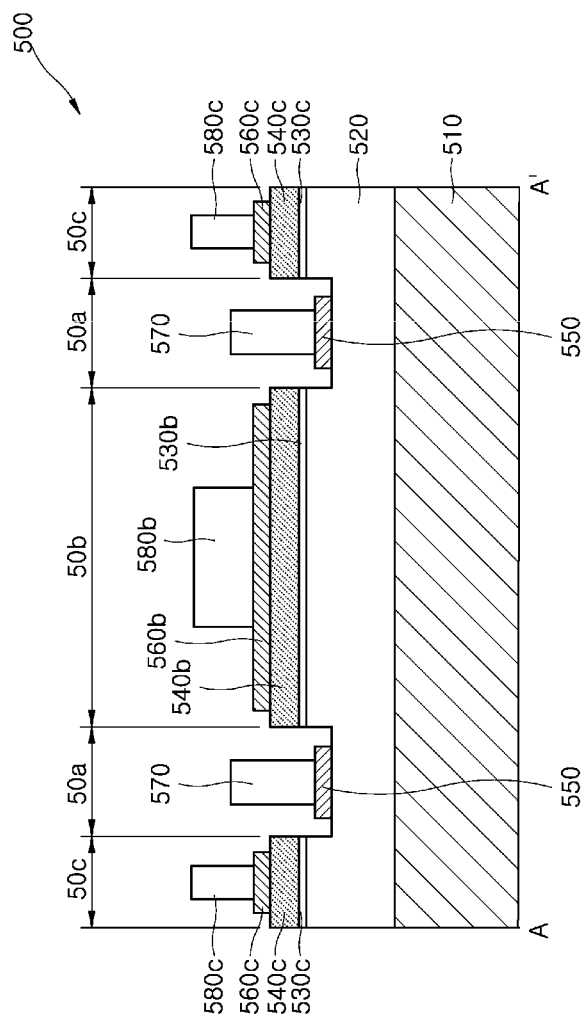
FIG. 5B is a cross-sectional view of the exemplary LED chip of FIG. 5A, taken along line A-A'.

FIG. 5A is a schematic plan or top-down view of an exemplary LED chip in accordance with an embodiment of the disclosed technology. FIG. 5B is a cross-sectional view of the exemplary LED chip of FIG. 5A, taken along line A-A'. Referring to FIGS. 5A and 5B, the LED chip 500 can include a first pattern layer region 50a, a second pattern layer region 50b, and a third pattern layer region 50c. The LED chip 500 can have a structure that emits light to the outside through a substrate 510, and include a bottom bump layer 570 and top bump layers 580b and 580c for flip-chip connection with a submount substrate.

The first pattern layer region 50a can include a first conductive type nitride-based semiconductor layer 520 stacked over the substrate 510. Furthermore, the first pattern layer region 50a can include a bottom electrode layer 550 over the first conductive-type nitride-based semiconductor layer 520. The second pattern region 50b can include the first conductive type nitride-based semiconductor layer 520, an active layer 530b, and a second conductive type nitride-based semiconductor layer 540b, which are sequentially stacked over the substrate 510 in one example. The first conductive type nitride-based semiconductor layer 520, active layer 530b, and second conductive type nitride-based semiconductor layer 540b can be arranged over the substrate 510 in various ways to have a stacked structure as shown in FIGS. 5A and 5B. Furthermore, the second pattern layer region 50b can include a top electrode layer 560b disposed over the second conductive type nitride-based semiconductor layer 540b. The third pattern region 50c can include the first conductive type nitride-based semiconductor layer 520, an active layer 530c, and a second conductive type nitride-based semiconductor layer 540c, which are sequentially stacked over the substrate 510 in one example. The first conductive type nitride-based semiconductor layer 520, active layer 530c, and second conductive type nitride-based semiconductor layer 540c can be arranged over the substrate 510 in various ways to have a stacked structure as shown in FIGS. 5A and 5B. Furthermore, the third pattern layer region 50c can include a top electrode layer 560c disposed over the second conductive type nitride-based semiconductor layer 540b.

For example, the substrate 510 can be formed of or include a transparent material such as sapphire ($Al_2O_3$). The first conductive type nitride-based semiconductor layer 520 can include a gallium nitride-based compound doped with an N-type or P-type dopant. For example, the first conductive type semiconductor layer 320 may include gallium nitride (GaN), aluminum gallium nitride ($Al_xGa_{1-x}N$: 0<x<1), indium gallium nitride (InGaN), or aluminum indium gallium nitride ($Al_xIn_yGa_{1-x-y}N$: 0≤x,y,x+y≤1), which is doped with an N-type or P-type dopant. The N-type dopant may include Si, for example, and the P-type dopant may include Mg, Zn, Cd, or a combination of two or more of Mg, Zn, or Cd, for example.

The active layers 530b and 530c can be arranged over the first conductive type nitride-based semiconductor layer 520. The active layers 530b and 530c arranged in the second and third pattern layer regions 50b and 50c, respectively, can be formed of or include the same material layer. The active layers 530b and 530c can generate light through combination of electrons and holes which are provided from the first conductive type nitride-based semiconductor layer 520 and the second conductive type nitride-based semiconductor layer 540. As shown in FIGS. 5A and 5B, the second conductive type nitride-based semiconductor layer 540 includes the second conductive type nitride-based semiconductor layers 540b and 540c in the the second and third pattern layer regions 50b and 50c, respectively. In accordance with an embodiment, the active layers 530b and 530c in the the second and third pattern layer regions 50b and 50c, respectively can have a multiple quantum well (MQW) structure to increase the combined efficiency of electrons and holes. For example, the active layers 530b and 530c may include indium gallium nitride (InGaN), gallium nitride (GaN), gallium aluminum nitride ($Ga_{1-a}Al_aN$, 0<a<1), aluminum indium gallium nitride ($Al_xIn_yGa_{1-x-y}N$: 0≤x,y,x+y≤1), or a combination of two or more of (InGaN), (GaN), ($Ga_{1-a}Al_aN$, 0<a<1), or ($Al_xIn_yGa_{1-x-y}N$: 0≤x,y,x+y≤1).

The second conductive type nitride-based semiconductor layers 540b and 540c can be arranged over the active layers 530b and 530c respectively. The second conductive type nitride-based semiconductor layers 540b and 540c arranged in the second and third pattern layer regions 50b and 50c, respectively, can be formed of or include the same material layer. The second conductive type nitride-based semiconductor layers 540b and 540c can include a gallium nitride-based compound doped with an N-type or P-type dopant. For example, the second conductive type nitride-based semiconductor layers 540b and 540c can include gallium nitride (GaN), aluminum gallium nitride ($Al_xGa_{1-x}N$: 0<x<1), indium gallium nitride (InGaN), or aluminum indium gallium nitride ($Al_xIn_yGa_{1-x-y}N$: 0≤x,y,x+y≤1), which is doped with an N-type or P-type dopant. The N-type dopant can include Si, for example, and the P-type dopant may include Mg, Zn, Cd, or a combination of two or more of Mg, Zn, or Cd, for example.

When the first conductive type nitride-based semiconductor layer 520 is doped with an N-type dopant, the second conductive type nitride-based semiconductor layers 540b and 540c can be doped with a P-type dopant, and when the first conductive type nitride-based semiconductor layer 520 is doped with a P-type dopant, the second conductive type nitride-based semiconductor layers 540b and 540c can be doped with a P-type dopant.

Referring back to the drawings of FIGS. 5A and 5B, a bottom electrode layer 550 can be arranged over the first conductive type nitride-based semiconductor layer 520 of the first pattern layer region 50a. The bottom electrode layer 550 can include a metal such as titanium, aluminum, chrome, nickel, or gold, for example. The bottom electrode 550 may have a stacked structure of one or more layers formed of or including an alloy of the metals. As illustrated in the drawings, the bottom electrode layer 550 can be arranged to cover the most or a substantial part of the first conductive type nitride-based semiconductor layer 520. The bottom electrode 550 can be arranged to surround the second pattern layer region 50b.

Furthermore, top electrode layers 560b and 560c can be arranged over the second conductive type nitride-based semiconductor layers 540b and 540c of the second and third pattern layer regions 50b and 50c, respectively. The top electrode layers 560b and 560c can include a metal such as titanium, aluminum, chrome, nickel, or gold, for example. The top electrode layers 560b and 560c can have a stacked structure of one or more layers formed of or including an alloy of the metals. As illustrated in the drawings, the top electrode layers 560b and 560c can be arranged to cover the most or a substantial part of the second conductive type nitride-based semiconductor layers 540b and 540c respectively.

In the present embodiment, the first conductive type nitride-based semiconductor layers 520 of the first pattern region 50a, the second pattern layer region 50b, and the third pattern region 50c can be physically coupled to each other. The active layer 530b and the second conductive type nitride-based semiconductor layer 540b of the second pattern layer region 50b can be isolated from the active layer 530c and the second conductive layer nitride-based semiconductor layer 540c of the third pattern layer region 50c by the first pattern layer region 50a.

In the present embodiment, the bottom bump layer 570 and the top bump layers 580b and 560c can be arranged over the bottom electrode layer 550 and the top electrode layers 560b and 560c, respectively. Since power for the LED chip 500 is received from the submount substrate through the bottom bump layer 570 and the top bump layers 580b and 580c, the arrangement, shape and area of the bottom bump layer 570 and the top bump layers 580b and 580c can have an influence on current crowding which occurs in the first conductive type nitride-based semiconductor layer 520 of the LED chip 500.

As illustrated in FIG. 5A, the bottom bump layer 570 can be positioned on a part of the bottom electrode layer 550. In an embodiment, the bottom bump layer 570 can be arranged in such a manner that a distance (b) from the bottom bump layer 570 to the boundary line of the second conductive type nitride-based semiconductor layer 540b of the second pattern layer region 50b is equal to a distance (a) from the bottom bump layer 570 to the boundary line of the second conductive type nitride-based semiconductor layer 540c of the third pattern layer region 30c. That is, the bottom bump layer 570 can be arranged in parallel to a first boundary line between the first and second pattern layer regions 50a and 50b and a second boundary line between the first and third pattern layer regions 50a and 50c. The longitudinal central axis 570a of the bottom bump layer 570 can be set along a line where a distance to the first boundary line from the longitudinal central axis 570a is equal to a distance to the second boundary line from the longitudinal central axis 570a.

Similarly, the top bump layers 580b and 580c can be arranged over the top electrode layers 560b and 560c, respectively. As illustrated in FIG. 5A, the top bump layers 580b and 580c can be positioned on a part of the top electrode layers 560b and 560c.

In order to reduce electrical resistance between an electrode pad and the bottom electrode layer 550 or between electrode pads and the top electrode layers 560b and 560c when the bottom bump layer 570 and the top bump layers 580b and 580c are coupled to the electrode pads of the submount substrate, the bottom electrode layer 550 or the top electrode layers 560b and 560c can be designed to occupy an area as large as possible.

In the LED chip 500 in accordance with the present embodiment, the third pattern layer region 50c including the active layer 530c, the second conductive type nitride-based semiconductor layer 540c, and the top electrode layer 560c can be arranged outside the first pattern layer region 50a including the first conductive type nitride-based semiconductor layer 520 and the bottom electrode layer 550. Therefore, it is possible to increase light emission around the LED chip 500, compared to the conventional LED chip. Furthermore, as different voltages are applied to the top bump layer 580b and the top bump layer 580c in the above-described structure, the amount of emitted light in the second pattern layer region 50b and the amount of emitted light in the third pattern layer region 50c can be controlled to be different from each other. That is, the light emission of the active layer 530b in the second pattern layer region 50b and the light emission of the active layer 530c in the third pattern layer region 50c can be controlled by applying different currents. Thus, the light density distributions around the LED chip 500 based on the applied currents can be easily controlled.

Furthermore, the bottom electrode layer 550 can be arranged in such a manner that the distance (b) from the bottom bump layer 550 to the second conductive type nitride-based semiconductor layer 540b of the second pattern layer region 50b is equal to the distance (a) from the bottom bump layer 550 to the second conductive type nitride-based semiconductor layer 540c of the third pattern layer region 50c. Thus, the extent of current spreading can be increased. For example, when electric current charges flow from the bottom electrode layer 550 toward the first conductive type nitride-based semiconductor layer 520 of the second pattern layer region 50b and the first conductive type nitride-based semiconductor layer 520 of the third pattern layer region 50c, electrical resistance can be reduced. Thus, electrons or holes can be supplied to a larger area of the active layers 530b and 530c. Therefore, the light emission efficiency of the active layers 530b and 530c can be increased.

As described above, multiple LED chips 500 each including the first pattern layer region 50a, the second pattern layer region 50b, and the third pattern layer region 50c can be arranged at a predetermined interval over a wafer. During a fabrication process of the LED chips 500, the LED chips 500 patterned over the wafer need to be electrically insulated from each other. In a specific embodiment, before the bottom electrode layer 550 and the top electrode layers 560b and 560c are formed or disposed over the wafer and the bottom bump layer 570 and the top bump layers 580b and 580c are formed or disposed over the bottom electrode layer 550 and the top electrode layers 560b and 560c, a trench for the electrical insulation can be formed to a predetermined depth in the substrate 510 through laser scribing for primarily isolating the LED chips 500. On the sidewalls of the substrates 510 which are primarily isolated by the isolation process using the laser scribing, an insulating layer such as silicon oxide or silicon nitride can be deposited to prevent a short circuit between the LED chips 500. A protective layer can be disposed to cover the bottom bump layer 570 and the top bump layers 580b and 580c to complete fabrication of the LED chips 500. The fabricated LED chips 500 can be separated from the wafer through a breaking process.

Figure 6A:
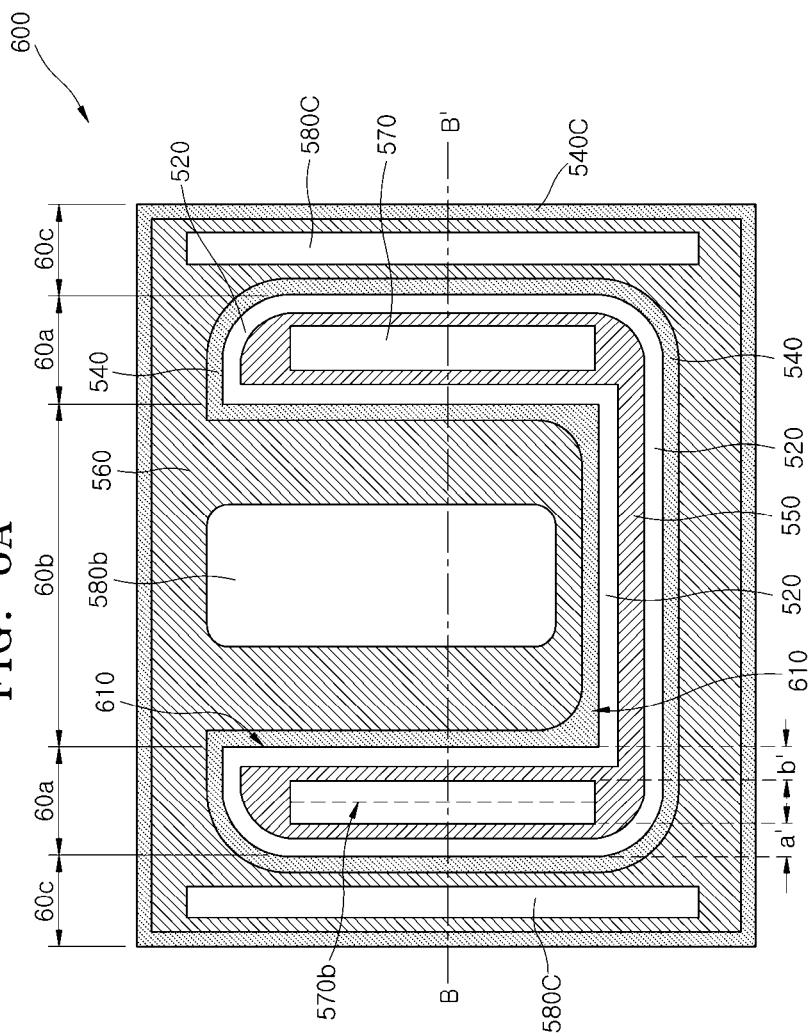
FIG. 6A is a schematic plan view of an exemplary LED chip in accordance with another embodiment of the disclosed technology.
Figure 6B:
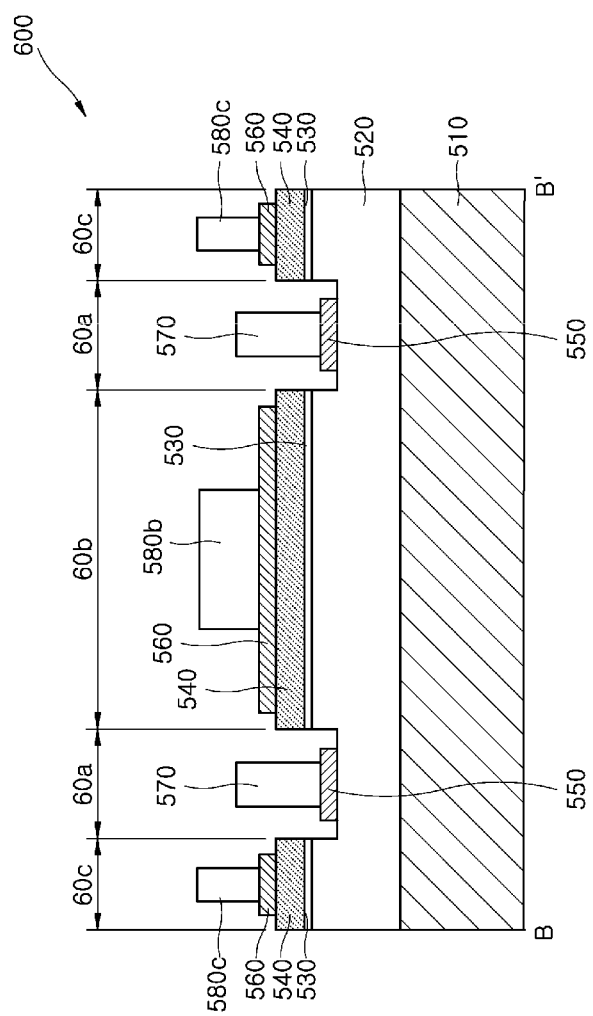
FIG. 6B is a cross-sectional view of the exemplary LED chip of FIG. 6A, taken along line A-A'.

FIG. 6A is a schematic plan view of an exemplary LED chip in accordance with another embodiment of the disclosed technology. FIG. 6B is a cross-sectional view of the exemplary LED chip of FIG. 6A, taken along line A-A'. Referring to FIGS. 6A and 6B, the LED chip 600 can include a first pattern layer region 60*a*, a second pattern layer region 60*b*, and a third pattern layer region 60*c*. The LED chip 600 can include a first pattern layer region 60*a* including one or more curved parts 610 having one or more predetermined shapes and a second pattern layer region 60*b* outside the first pattern layer region 60*a*.

The LED chip 600 is different from the LED chip 500 described with reference to FIGS. 5A and 5B in that the first pattern layer region 60*a* does not completely surround another pattern layer region including an active layer.

As illustrated in the drawings of FIGS. 6A and 6B, the first pattern layer region 60*a* of the LED chip 600 can include a first conductive type nitride-based semiconductor layer 520 stacked over a substrate 510. Furthermore, the first pattern layer region 60*a* can include a bottom electrode layer 550 disposed over the first conductive type nitride-based semiconductor layer 520. The second pattern region 60*b* can include the first conductive type nitride-based semiconductor layer 520, an active layer 530, and a second conductive type nitride-based semiconductor layer 540, which are sequentially stacked over the substrate 510, in one example. The first conductive type nitride-based semiconductor layer 520, active layer 530, and second conductive type nitride-based semiconductor layer 540 can be arranged over the substrate 510 in various ways to have a stacked structure as shown in FIGS. 6A and 6B. Furthermore, the second pattern layer region 60*b* can include a top electrode layer 560 disposed over the second conductive type nitride-based semiconductor layer 540. The first conductive type nitride-based semiconductor layers 520 of the first pattern region 60*a* and the second pattern region 60*b* can be physically coupled to each other.

The active layer 530, the second conductive type nitride-based semiconductor layer 540, the top electrode 560, and the top bump layer 580*b* and 580*c* can be formed of or include the same materials as the active layers 530*b* and 530*c*, the second conductive type nitride-based semiconductor layers 540*b* and 540*c*, the top electrode layers 560*b* and 560*c*, and the top bump layers 580*b* and 580*c*, respectively, which have been described with reference to FIGS. 5A and 5B. Furthermore, components having the same reference numerals and names as those illustrated in FIGS. 5A and 5B may have substantially the same configuration. Thus, detailed description thereof will be omitted to avoid redundant description.

Referring to FIG. 6A, the first pattern layer region 60*a* having a curved shape can include a U-shaped pattern region having a predetermined width, for example. The first pattern layer region 60*a* can be arranged to surround at least a part of the second pattern layer region 60*b*. Thus, the top bump layer 580*b* of the second pattern layer region 60*b* can be arranged over the top electrode layer 560 surrounded by the curved part 610 and the top electrode layer 560 outside the curved part 610.

On the plan pattern of FIG. 6A, the bottom bump layer 570 can be arranged in the first pattern layer region 60*a* such that distances a' and b' to the second conductive type nitride-based semiconductor layers 540 adjacent to both sides of the bottom bump layer 570 are equal to each other. The bottom bump layer 570 can be arranged in parallel to either boundary line between the first and second pattern layer regions 60*a* and 60*b*. At this time, the longitudinal central axis 570*b* of the bottom bump layer 570 can be set along a line where the distance to one boundary line from the longitudinal central axis 570*b* is equal to the distance to the other boundary line from the longitudinal central axis 570*b*.

In accordance with the present embodiment, the first pattern layer region 60*a* including the bottom electrode layer 550 can be arranged between the second pattern layer regions 60*b* including the active layer 530 and third patter layer region 60*c*. Thus, current spreading from the first pattern layer region 60*a* to the second pattern layer region 60*b* can be improved, and the light emission efficiency of the peripheral part of the LED chip can be improved. Furthermore, as the current spreading is improved, the resistance in the first conductive type nitride-based semiconductor layer 520 can be reduced to provide a uniform current for light emission of the LED chip. Thus, the forward voltage of the LED chip can be reduced.

FIGS. 7, 8, 9, 10 and 11 are diagrams for explaining an exemplary method for fabricating a light emitting device (e.g., an LED package device) in accordance with an embodiment of the disclosed technology.

Figure 7:
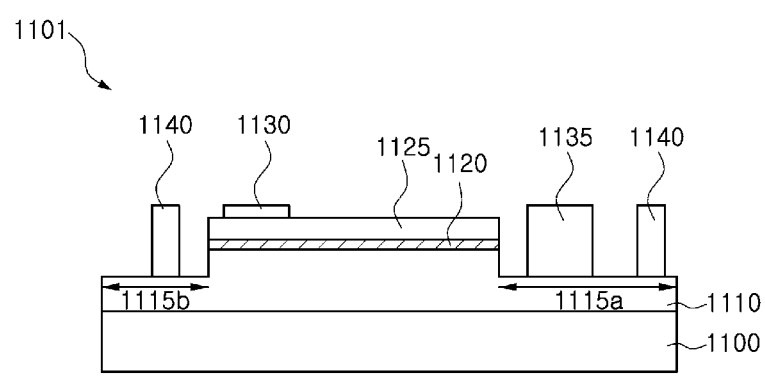
FIGS. 7 through 11 are diagrams for explaining an exemplary method for fabricating a light emitting device in accordance with an embodiment of the disclosed technology.

Referring to FIG. 7, a light emitting device can include a light emitting cell (e.g., an LED) 1101 including a first semiconductor layer 1110, an active layer 1120, a second semiconductor layer 1125, and a first electrode pad 1135, and a second electrode pad 1130, which are formed or stacked over a substrate 1100. The light emitting cell 1101 in accordance with the embodiment of the disclosed technology can have a lateral structure in which two electrodes having different polarities, for example, the first and second electrode pads 1135 and 1130 are arranged on the same plane.

The substrate 1100 can be provided or implemented as a semiconductor growth substrate, and formed of or including a material having a light transmitting property. For example, the substrate 1100 can be formed of or include a transparent material such as sapphire. However, the substrate 1100 is not limited to a sapphire, and can be formed of or include a material that includes silicon carbide (SiC), zinc oxide (ZnO), silicon (Si), gallium arsenic (GaAs), and gallium nitride (GaN).

The first semiconductor layer 1110 arranged over the substrate 1100 can include gallium nitride (GaN) doped with a first conductive type impurity, for example, an N-type conductive impurity. The first conductive type impurity applied to the first semiconductor layer 1110 can be selected from a group that includes N-type impurities such as silicon (Si), germanium (Ge), and in (Sn). A part of a surface of the first semiconductor layer 1110 can be exposed or etched to be at a lower position than the other stacked layers. For example, the second semiconductor layer 1125, the active layer 1120, and the first semiconductor layer 1110 can be partially mesa-etched to expose surface regions 1115*a* and 1115*b* of the first semiconductor layer 1110. At this time, the surfaces 1115*a* and 1115*b* of the first semiconductor layer 1110, exposed through the mesa-etching, can be positioned at a lower level than the bottom surface of the active layer 1120.

The active layer 1120 arranged over the first semiconductor layer 1110 can emit light at a predetermined level of energy through recombination of electrons and holes, and have a multi-quantum well (MQW) structure in which a quantum well layer (not illustrated) and a quantum barrier layer (not illustrated) are alternately stacked. For example, the quantum well layer can be formed of or include an InGaN-based material, and the quantum barrier layer can be formed of or include a GaN-based material or InGaN-based material.

The second semiconductor layer 1125 can be arranged over the active layer 1120. The second semiconductor layer 1125 can include gallium nitride (GaN) doped with a second conductive type impurity, for example, a P-type impurity. The second conductive type impurity may be selected from a group that includes P-type impurities such as Mg and Zn.

The first electrode pad 1135 can be arranged over the first exposed surface 1115a arranged at one side of the first semiconductor layer 1110. The first electrode pad 1135 can be arranged to at least partially cover the first exposed surface 1115a of the first semiconductor layer 1110. Furthermore, the second electrode pad 1130 can be arranged over the second semiconductor layer 1125. The second electrode pad 1130 can be arranged to at least partially cover a surface of the second semiconductor layer 1125. The first electrode pad 1135 can be formed to protrude from the first exposed surface 1115a of the first semiconductor layer 1110, and positioned at the same level or height as the top surface of the second electrode pad 1130 arranged over the second semiconductor layer 1125. The first and second electrode pads 1135 and 1130 can be formed of or include a metal such as copper (Cu), gold (Au), or silver (Ag), which has excellent electrical conductivity.

A first guard pattern 1140 can be arranged over the first exposed surface 1115a arranged at one side of the first semiconductor layer 1110 and the second exposed surface 1115b arranged at the other side of the first semiconductor layer 1110. The first guard pattern 1140 can be formed outside the first electrode pad 1135, and have a ring shape to surround four surfaces of the light emitting device. The first guard pattern 1140 can be formed of or include a GaN-based material or AlGaN-based material doped with a first conductive type impurity. The first conductive type impurity can be selected from a group that includes N-type impurities such as Si, Ge, and Sn.

Figure 8:
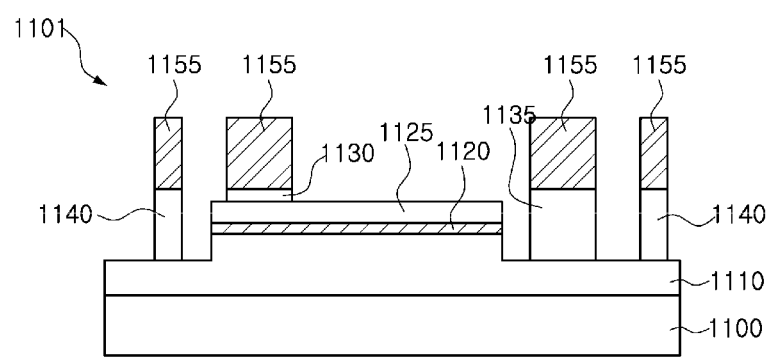

Referring to FIG. 8, a bump-shaped coupling electrode 1155 can be formed over the first electrode pad 1135, the second electrode pad 1130, and the first guard pattern 1140. The coupling electrode 1155 can be formed of or include any one of Al, Au, Cu, Fe, Ni, Sn, or an alloy of metals that includes Al, Au, Cu, Fe, Ni or Sn. Furthermore, the coupling electrode 1155 can be plated with any one of In, Sn, Ni, Cu, or an alloy of metals that includes In, Sn, Ni, or Cu, in order to improve an adhesive force with the first and second electrode pads 1135 and 1130 and the first guard pattern 1140.

Figure 9:
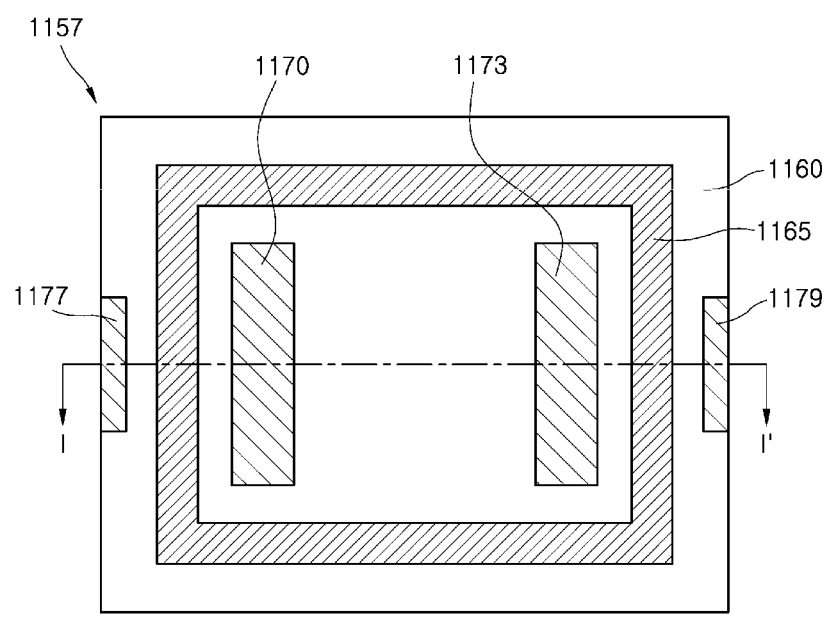
Figure 10:
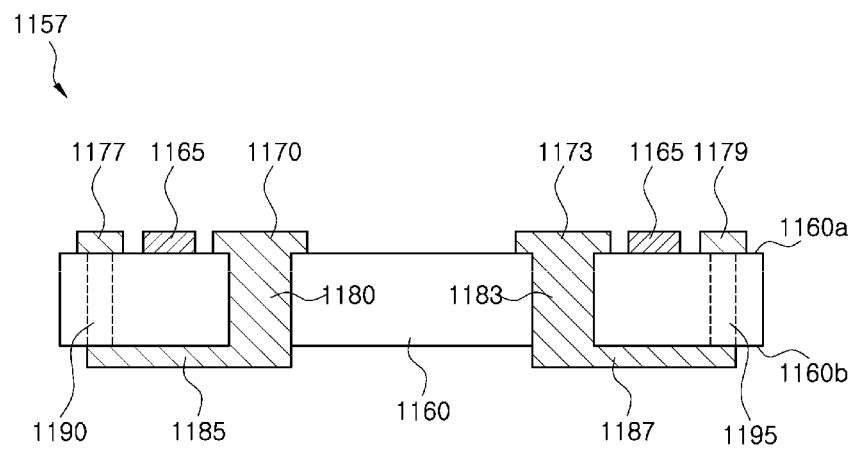

Referring to FIGS. 9 and 10, a subrnount substrate 1157 to which the light emitting cell 1101 is to be flip-chip bonded can be prepared. FIG. 10 is a cross-sectional view of the subrnount substrate 1157 of FIG. 9, taken along I-I' line. The subrnount substrate 1157 can include a substrate base 1160, inner bonding pads 1170 and 1173 arranged on a top surface 1160a of the substrate base 1160, outer bonding pads 1177 and 1179, a second guard pattern 1165 arranged between the inner bonding pads 1170 and 1173 and the outer bonding pads 1177 and 1179, and rewiring electrodes 1185 and 1187 arranged on a bottom surface 1160b of the substrate base 1160. The inner bonding pads 1170 and 1173 can be arranged in a rectangular shape such as a bar shape.

The second guard pattern 1165 can be arranged on the top surface 1160a of the substrate base 1160, and formed in a ring shape surrounding the inner bonding pads 1170 and 1173. The second guard pattern 1165 can include a GaN-based material or AlGaN-based material doped with the first conductive type impurity. The first conductive type impurity may be selected from a group that includes N-type conductive impurities such as Si, Ge, and Sn.

The substrate base 1160 can include inner through-hole electrodes 1180 and 1183 and outer through-hole electrodes 1190 and 1195. The inner through-hole electrodes 1180 and 1183 can couple the inner bonding pads 1170 and 1173 to the rewiring electrodes 1185 and 1187 arranged on the bottom surface 1160b of the substrate base 1160, and the rewiring electrodes 1185 and 1187 can be coupled to the outer bonding pads 1177 and 1179 through the outer through-hole electrodes 1190 and 1195. Thus, the inner through-hole electrodes 1180 and 1183 and the outer through-hole electrodes 1190 and 1195 can be electrically coupled to each other. The inner bonding pads 1170 and 1173, the outer bonding pads 1177 and 1179, the inner through-hole electrodes 1180 and 1183, the outer through-hole electrodes 1190 and 1195, or the rewiring electrodes 1185 and 1187 can be formed of or include a metallic material having excellent electrical conductivity. For example, the metallic material can include Cu.

Figure 11:
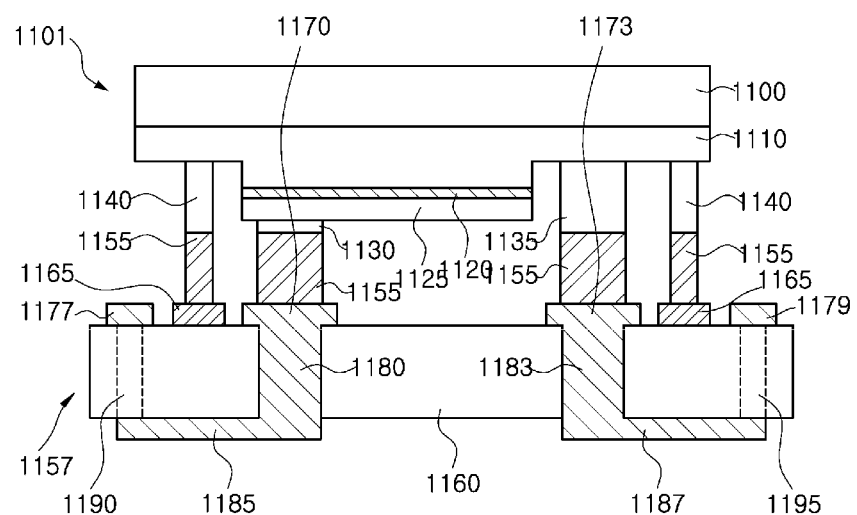

Referring to FIG. 11, the light emitting cell 1101 and the submount substrate 1157 can be coupled through a flip-chip bonding method so as to form a light emitting device. The flip-chip bonding process in accordance with the embodiment of the disclosed technology can be performed through the bump-shaped coupling electrode 1155 such that the first semiconductor layer 1110 of the light emitting cell 1101 is electrically coupled to the first inner bonding pad 1173 and the first outer bonding pad 1179 of the submount substrate 1157 through the first electrode pad 1135 and the coupling electrode 1155. Furthermore, the second semiconductor layer 1125 of the light emitting cell 1101 can be electrically coupled to the second inner bonding pad 1170 and the second outer bonding pad 1177 of the submunt substrate 1157 through the second electrode pad 1130 and the coupling electrode 1155. Furthermore, the first guard pattern 1140 may be connected and attached to the second guard pattern 1165 through corresponding coupling electrode 1155.

At this time, the bonding process may be performed by connecting the coupling electrode 1155 to the respective electrodes and/or bond pads through heat, for example. In this case, the flip-chip bonding process can be performed in a vacuum state or nitrogen (N2) atmosphere such that the inner space of the first and second guard patterns 1140 and 1165 is maintained in a vacuum state. Thus, even when the light emitting cell 1101 and the submunt substrate 1157 are directly bonded, the light emitting cell 1101 and the submunt substrate 1157 can be sealed to protect the light emitting device from outside. Furthermore, as the first guard pattern 1140 surrounding the front surface of the light emitting cell 1101 and the second guard pattern 1165 surrounding the submunt substrate 1157 are coupled to form the light emitting device, the light emitting device can be sealed and prevented from being exposed to the air. Thus, it is possible to prevent the reliability of the light emitting device from being degraded by moisture absorption. Furthermore, since the light emitting device can be sealed without applying an underfill resin layer, it is possible to prevent the reduction of the light emitting area, which may occur when photons disappear due to the underfill resin layer.

Figure 12:
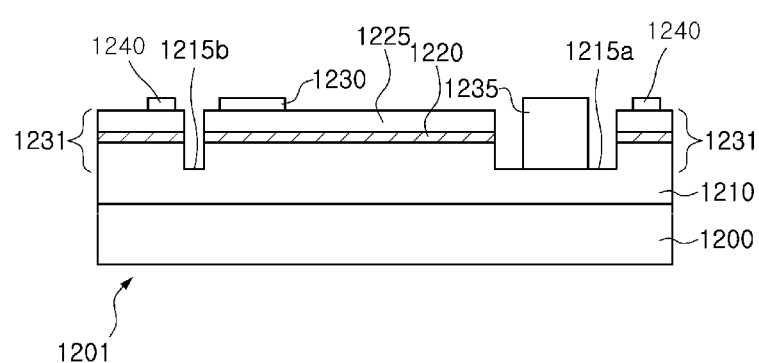
FIGS. 12 through 14 are diagrams for explaining an exemplary method for fabricating a light emitting device in accordance with an another embodiment of the disclosed technology.
Figure 13:
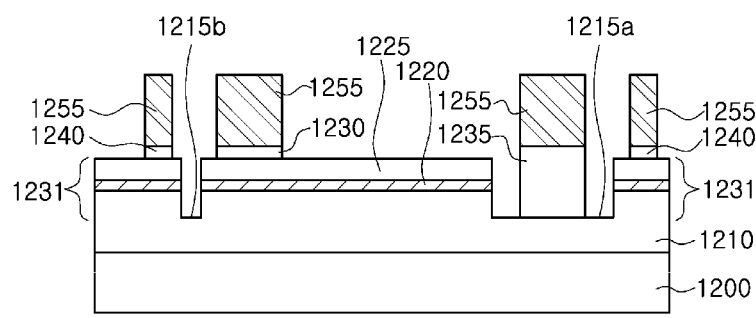
Figure 14:
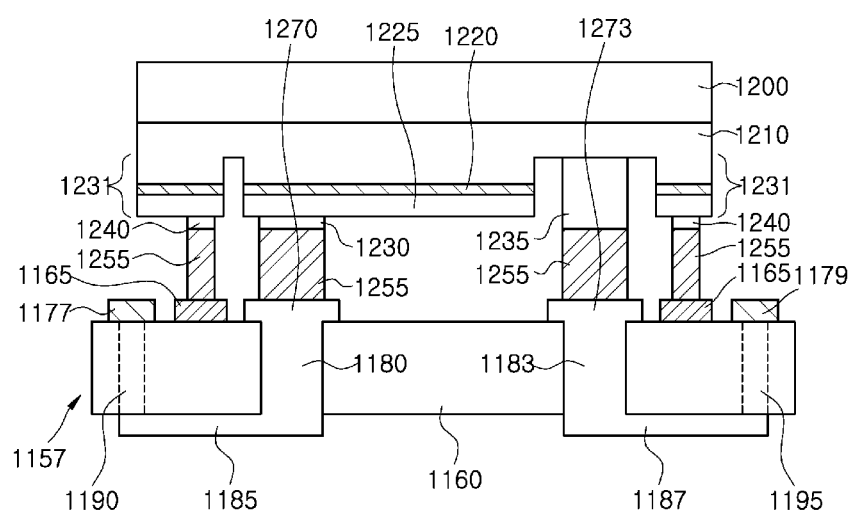

FIGS. 12 to 14 are diagrams for explaining an exemplary method for fabricating an LED chip in accordance with another embodiment of the disclosed technology.

Referring to FIGS. 12 and 13, a light emitting cell 1201 can be prepared, and coupling electrodes 1255 can be formed over the light emitting cell 1201. As illustrated in FIG. 12, the light emitting cell 1201 can include a first semiconductor layer 1210, an active layer 1220, a second semiconductor layer 1225, a first electrode pad 1235, and a second electrode pad 1230, which are formed or stacked over a substrate 1200. The substrate 1200 can be formed of or include a transparent material such as sapphire, which has a light transmitting property.

The first semiconductor layer 1210 arranged over the substrate 1200 can include gallium nitride (GaN) doped with a first conductive type impurity, for example, an N-type impurity. A part of a surface of the first semiconductor layer 1210 can be exposed or etched to be at a lower level than other stacked layers. For example, the second semiconductor layer 1225, the active layer 1220, and the first semiconductor layer 1210 may be partially mesa-etched to expose surface regions 1215a and 1215b of the first semiconductor layer 1210. At this time, the surfaces 1215a and 1215b of the first semiconductor layer 1210, exposed through the mesa-etching, can be positioned at a lower level than the bottom surface of the active layer 1220. In this case, a guard semiconductor layer 1231 can be formed at the edge of the light emitting cell 1201 through the mesa-etching. The guard semiconductor layer 1231 can have a shape surrounding a border of the light emitting cell 1201. The top surface of the guard semiconductor layer 1231 can be positioned at the same level or height as the top surface of the second semiconductor layer 1225 of the light emitting cell 1201. The exposed surface 1215b formed at one side can have a smaller area than the exposed surface 1215a formed at the other side.

The active layer 1220 and the second semiconductor layer 1225 can be sequentially stacked over the first semiconductor layer 1210 in one example. The active layer 1220 and the second semiconductor layer 1225 can be arranged over the first semiconductor layer 1210 in various ways to have a stacked structure. The active layer 1220 can be formed to have a multiple quantum well (MQW) structure, and the second semiconductor layer 1225 can include GaN doped with a second conductive type impurity, for example, a P-type impurity. The second conductive impurity can be selected from a group that includes P-type impurities such as Mg and Zn.

The first electrode pad 1235 can be arranged over the first exposed surface 1215a positioned at the one side of the first semiconductor layer 1210. The first electrode pad 1235 can be arranged to at least partially cover the first exposed surface 1215a of the first semiconductor layer 1210. Furthermore, the second electrode pad 1230 can be arranged over the second semiconductor layer 1225. The second electrode pad 1230 can be arranged to at least partially cover the surface of the second semiconductor layer 1225. The first electrode pad 1235 can be formed to have the same level or height as the top surface of the second electrode pad 1230. The first and second electrode pads 1235 and 1230 can be formed of or include a metal such as Cu, Au, or Ag, which has excellent electrical conductance.

A first guard pattern 1240 can be arranged over the guard semiconductor layer 1231 positioned at the edge of the light emitting cell 1201. The first guard pattern 1240 can be formed along the guard semiconductor layer 1231, and have a ring shape surrounding four surfaces of the light emitting cell 1201. The first guard pattern 1240 can include a GaN-based material or AlGaN-based material doped with a first conductive type impurity. The first conductive type impurity can be selected from a group that includes N-type impurities such as Si, Ge, and Sn. The guard semiconductor layer 1231 can be formed to have the same level or height as the top surface of the second semiconductor layer 1225. Thus, the first guard pattern 1240 may be formed to have the same level or height as the second electrode pad 1230 formed over the second semiconductor layer 1225.

Referring to FIG. 13, a bump-shaped coupling electrode 1255 can be formed over the first electrode pad 1235, the second electrode pad 1230, and the first guard pattern 1240. The coupling electrode 1255 can be formed of or include any one of Al, Au, Cu, Fe, Ni, Sn, or an alloy of metals that includes Al, Au, Cu, Fe, Ni, or Sn. The coupling electrode 1255 can be plated with any one metal of In, Sn, Ni, Cu, or an alloy of metals that includes In, Sn, Ni, or Cu, in order to improve an adhesive force with the first and second electrode pads 1235 and 1230 and the first guard pattern 1240.

Referring to FIG. 14, the light emitting cell 1201 can be flip-chip bonded to the submunt substrate 1157 of FIGS. 9 and 10 so as to form a light emitting device. The process of flip-chip bonding the light emitting cell 1201 to the submunt substrate 1157 can be performed through the coupling electrodes 1255 as described with reference to FIG. 11. The first guard pattern 1240 of the light emitting cell 1201 can be coupled to the second guard pattern 1165 of the submunt substrate 1157 through the coupling electrodes 1255 so as to seal the light emitting device.

In accordance with the embodiment of the disclosed technology, as the first guard pattern 1240 is formed over the guard semiconductor layer 1231 after the guard semiconductor layer 1231 is previously formed to surround the edge of the light emitting cell 1201, it is possible to previously designate the position at which the submunt substrate 1157 is coupled to the second guard pattern 1165. Furthermore, the guard semiconductor layer 1231 can be formed to have the same level or height as the top surface of the second semiconductor layer 1225. Thus, when the first guard pattern 1240 is subsequently formed, the first guard pattern 1240 can be formed at a lower level or height than when the guard semiconductor layer 1231 is not formed. Thus, it is possible to shorten the process time.

Only a few embodiments, implementations and examples are described and other embodiments and implementations, and various enhancements and variations can be made based on what is described and illustrated in this document.

What is claimed is:

1. An LED chip comprising:
   a first pattern layer region;
   a second pattern layer region; and
   a third pattern layer region at least partially surrounding the first pattern layer region,
   wherein the first pattern layer region is located between the second pattern layer region and the third pattern layer region and comprises a first conductive type nitride-based semiconductor layer and a bottom electrode layer that are stacked over a substrate, and
   wherein each of the second and third pattern layer regions comprises a first conductive type nitride-based semiconductor layer, an active layer, a second conductive type nitride-based semiconductor layer, and a top electrode layer that are stacked over the substrate, wherein the bottom electrode layer includes portions located on opposite sides of the second conductive type nitride-based semiconductor layer of the second pattern layer region,
   wherein the third pattern layer region is the closest to an edge of the LED chip as compared to the first pattern layer region and the second pattern layer region, wherein the LED chip further comprises:
a bottom bump layer arranged over the bottom electrode layer; and
a top bump layer arranged over the top electrode layer, and
wherein the bottom bump layer is arranged in such a manner that a distance from the bottom bump layer to the second conductive type nitride-based semiconductor layer of the second pattern layer region is equal to a distance from the bottom bump layer to the second conductive type nitride-based semiconductor layer of the third pattern layer region, and
wherein the bottom bump layer is arranged in parallel to a first boundary line between the first and second pattern layer regions and a second boundary line between the first and third pattern layer regions, and
a longitudinal central axis of the bottom bump layer is set along a line where a distance from the longitudinal central axis to the first boundary line is equal to a distance from the longitudinal central axis to the second boundary line.

2. The LED chip of claim 1, wherein the first conductive type nitride-based semiconductor layers of the first, second and third pattern layer regions are physically coupled to each other.

3. The LED chip of claim 1, wherein the active layer and the second conductive type nitride-based semiconductor layer of the second pattern layer region are isolated from the active layer and the second conductive type nitride-based semiconductor layer of the third pattern layer region by the first pattern layer region.

4. The LED chip of claim 1, wherein the active layer in the second pattern layer region and the active layer in the third pattern layer region are configured to emit light responsive to different currents.

5. An LED chip comprising:
a first pattern layer region including a first portion having one or more curved parts and including a second portion;
a second pattern layer region at least partially surrounding the first portion of the first pattern layer region and at least partially surrounded by the second portion of the first pattern layer region,
wherein the first pattern layer region comprises a first conductive type nitride-based semiconductor layer, a bottom electrode layer, and a bottom bump layer that are stacked over a substrate,
wherein the second pattern layer region comprises a first conductive type nitride-based semiconductor layer, an active layer, a second conductive type nitride-based semiconductor layer, and a top electrode layer stacked over the substrate, and
wherein the bottom electrode layer located in the second portion of the first pattern layer region includes portions located on opposite sides of the second conductive type nitride-based semiconductor layer,
wherein the bottom bump layer is formed over the bottom electrode layer located in the first portion of the first pattern layer region,
wherein the bottom bump layer is arranged in the first pattern layer region such that distances to the second conductive type nitride-based semiconductor layers adjacent to both sides of the bottom bump layer are equal to each other,
wherein the bottom bump layer is arranged in parallel to either boundary line between the first and second pattern layer regions; and
wherein a longitudinal central axis of the bottom bump layer is set along a line where a distance to one of the boundary lines from the longitudinal central axis is equal to a distance to the other boundary line from the longitudinal central axis.

6. The LED chip of claim 5, wherein the first conductive type nitride-based semiconductor layers of the first and second pattern layer regions are physically coupled to each other.

7. The LED chip of claim 5, wherein the one or more curved parts comprise a region shaped to form a U-shaped pattern or a V-shaped pattern having a predetermined width.

8. The LED chip of claim 5, wherein the one or more curved parts are arranged to at least partially surround the bottom bump layer.

9. The LED chip of claim 5, wherein the bottom electrode layer and the top electrode layer are formed along boundary lines defining the first pattern layer region and the second pattern layer region, respectively.

10. The LED chip of claim 9, wherein the top bump layer is formed along a boundary line defining the top electrode layer.

11. The LED chip of claim 9, wherein the bottom bump layer is arranged on a part of the bottom electrode layer surrounded by the one or more curved parts.

12. The LED chip of claim 5, wherein the first pattern layer region includes a protrusion pattern to increase an extent of current spreading into the first pattern layer region from the second pattern layer region adjacent to the protrusion pattern.

13. The LED chip of claim 5, comprising:
a top bump layer disposed over the top electrode layer.

14. The LED chip of claim 5, wherein the first pattern layer region includes a curved portion.

15. The LED chip of claim 5, wherein the second pattern layer region includes a curved portion.

* * * * *